(12) United States Patent
Kohno

(10) Patent No.: US 6,857,764 B2
(45) Date of Patent: Feb. 22, 2005

(54) ILLUMINATION OPTICAL SYSTEM AND EXPOSURE APPARATUS HAVING THE SAME

(75) Inventor: Michio Kohno, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/342,210

(22) Filed: Jun. 29, 1999

(65) Prior Publication Data

US 2002/0039291 A1 Apr. 4, 2002

(30) Foreign Application Priority Data

Jun. 30, 1998 (JP) .......................................... 10-184040

(51) Int. Cl.$^7$ ............................. F21V 13/12; G02B 6/32
(52) U.S. Cl. ....................... 362/268; 362/235; 362/259; 362/554; 385/33
(58) Field of Search ................................ 362/235, 259, 362/268, 331, 551, 554, 560; 385/31, 33, 116, 119, 901

(56) References Cited

U.S. PATENT DOCUMENTS

| | | | | |
|---|---|---|---|---|
| 3,754,814 A | * | 8/1973 | Leith ........................... | 359/599 |
| 4,375,315 A | * | 3/1983 | Lacombat et al. .......... | 385/116 |
| 4,497,013 A | * | 1/1985 | Ohta ........................... | 362/551 |
| 4,530,565 A | * | 7/1985 | Markle ....................... | 362/551 |
| 4,683,524 A | * | 7/1987 | Ohta ........................... | 362/268 |
| 4,705,940 A | | 11/1987 | Kohno ........................ | 250/201 |
| 4,851,978 A | * | 7/1989 | Ichihara ...................... | 362/268 |
| 4,883,333 A | * | 11/1989 | Yanez ......................... | 362/551 |
| 5,218,660 A | * | 6/1993 | Omata ........................ | 385/116 |
| 5,559,911 A | * | 9/1996 | Forkner et al. .............. | 385/33 |
| 5,661,837 A | * | 8/1997 | Yamamoto et al. ......... | 385/901 |
| 5,680,492 A | * | 10/1997 | Hopler et al. ............... | 385/119 |
| 5,706,376 A | * | 1/1998 | Rykowski et al. ........... | 385/33 |
| 5,719,704 A | * | 2/1998 | Shiraishi et al. ............ | 359/558 |
| 5,797,674 A | * | 8/1998 | Nagayama .................. | 362/268 |
| 5,971,576 A | * | 10/1999 | Tomioka et al. ............ | 362/560 |

FOREIGN PATENT DOCUMENTS

JP          5-68846          9/1993

OTHER PUBLICATIONS

Stroke, George W., "An Introduction to Coherent Optics and Holography", Jan. 1966, Academic Press Inc., pp. 26–29, 118–119, 164–165.*

* cited by examiner

Primary Examiner—Alan Cariaso
(74) Attorney, Agent, or Firm—Fitzpatrick, Cella, Harper & Scinto

(57) ABSTRACT

An illumination optical system includes a luminous intensity distribution converting optical system for converting an illuminance distribution of a light source image into a luminous intensity distribution upon a predetermined plane, a light transmitting element having its light entrance surface disposed substantially in coincidence with the predetermined plane, and a light collecting optical system for defining an illumination region upon a surface to be illuminated, by use of light from the light transmitting element.

39 Claims, 10 Drawing Sheets

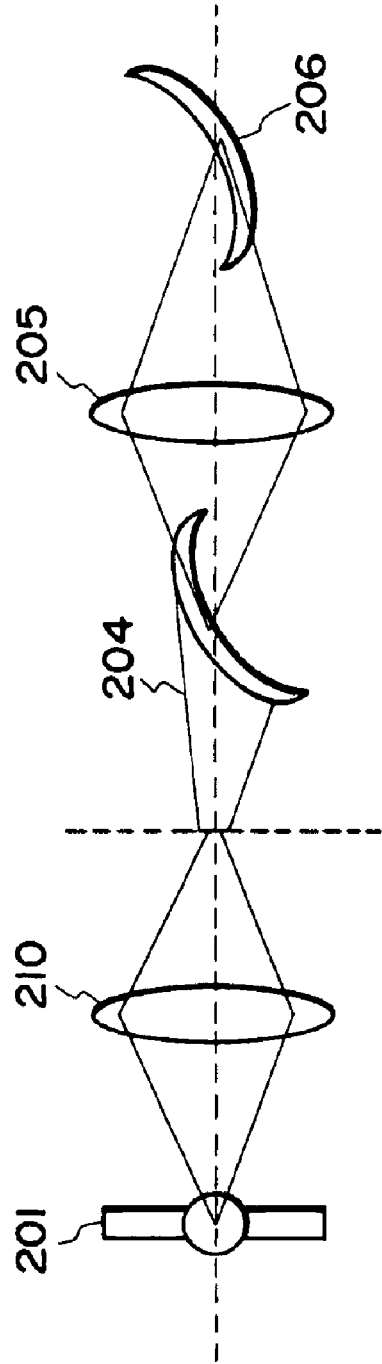
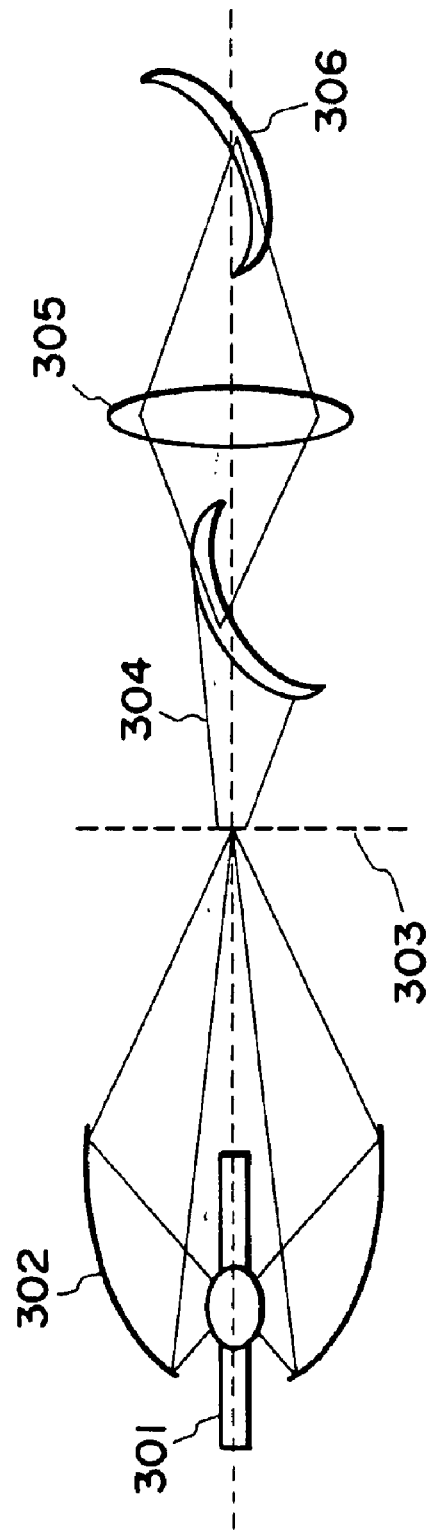

ILLUMINANCE DISTRIBUTION

LUMINOUS INTENSITY DISTRIBUTION

ILLUMINATION OPTICAL SYSTEM AND EXPOSURE APPARATUS HAVING THE SAME

FIELD OF THE INVENTION AND RELATED ART

This invention relates to an illumination optical system and, more particularly, to an illumination optical system suitably usable in an exposure apparatus for the manufacture of semiconductor devices.

The procedure of mass production of fine semiconductor devices or liquid crystal flat panels includes a lithography process. In this process, a circuit original (mask) is illuminated by an illumination optical system and with light from a light source such as a Hg lamp, and, by using a high resolution projection optical system, a circuit pattern of the original is transferred and printed on a photosensitive substrate (wafer). Exposure apparatuses used in such lithographic process may be generally classified into a stepper (sequential exposure method) wherein exposure and step-wise motion of a substrate are repeated (the exposure being made while the wafer is held stationary) and a scanner wherein an original and a substrate are moved in synchronism with each other, in repetition. Particularly, for mass production of liquid crystal flat panels, whole-exposure type unit-magnification scanning exposure apparatuses are used.

FIG. 1 illustrates such whole-exposure type scanning exposure apparatus for use in manufacture of liquid crystal flat panels. In the apparatus of FIG. 1, an ultra-high pressure Hg lamp 101 is used as a light source which emits, as a main spectrum, light of I-line (365 nm), h-line (405 nm) or g-line (436 nm). The light from the light source is once collected by an elliptical mirror 102 upon a light entrance surface of a light integrator 103. The light integrator 103 specifically comprises a fly's eye lens having a plurality of convex lenses. Ultraviolet light beams emitted from the light integrator 103 are once projected by a collimator 104 onto a plane 105 to be illuminated. Disposed on this plane 105 is a slit plate having an opening of arcuate shape such as shown in FIG. 2, for restricting the illumination range. Imaging optical system 106 serves to image the arcuate slit plate (as object plane) so that an illumination region of an arcuate shape is defined on a mask 107. This is the structure of an illumination optical system.

The mask 107 has a circuit pattern formed thereon by using metal such as chromium. Light from this surface of the mask (as an object plane) then enters a unit-magnification and mirror whole-projection exposure optical system 115. This projection optical system 115 basically comprises two mirrors of a concave surface mirror 111 and a convex surface mirror 112. Flat mirrors 110 and 113 function to deflect the light path, so that a mask 107 and a glass plate (wafer) 114 having a coating of photosensitive resist can be scanned in synchronism with each other in the same direction (the direction of arrows in the drawing). Light emitted from a single point on the mask 107 is reflected by mirrors 110, 111, 112, 111 and 113, in this order, and it is collected upon the plate 114. Then, by using a portion of a good-image region of arcuate shape (the above-described illumination region) which is revolutionally symmetric with respect to the optical axis 0-0' of the projection system 115, the circuit pattern of the mask 7 is transferred to the plate.

In the apparatus shown in FIG. 1, however, since an arcuate range 108 is extracted from the illumination region 109 (of square or rectangular shape) of the fly's eye lens as shown in FIG. 2, the illumination efficiency is undesirably low.

Japanese Published Patent Application, Publication No. 068846/1993 shows an optical system wherein an optical fiber is used to directly define an arcuate illumination region. FIG. 3 shows such an optical system. Light from a Hg lamp 201 is collected by a condenser lens 21 onto the light entrance surfaces of a fiber bundle 204. The light entrance surfaces of the fiber bundle 204 have a circular or rectangular (square) shape, and the light exit surfaces of the bundle are bound into a arcuate shape to meet a projection optical system. Denoted at 205 is a condensing optical system, wherein an arcuate imaging plane 206 corresponds to the illumination surface 105 or the mask 107 in FIG. 1. Since, however, in the optical system of FIG. 3, only a portion of the light from the lamp corresponding to the opening face of the condenser lens 210 can be caught, the illumination efficiency is very low.

FIG. 4 shows another optical system also disclosed in Japanese Published Patent Application, Publication No. 068846/1993. In this case, the light emission point of a lamp 301 is disposed at a first focal point of an elliptical mirror 302, so that the light can be caught by the mirror 302 without loss. The light is directed to a fiber bundle 304 having its light entrance surface disposed at a plane containing the second focal point (second focal plane 303). After it, like the optical system of FIG. 3, the fiber bundle 304 defines an arcuate illumination region, and efficient illumination is provided.

However, even in apparently efficient arrangement of FIG. 4, there are serious inconveniences such as discussed below.

FIG. 5 illustrates light emission distribution of an ultra-high pressure Hg lamp. When a plane PL extending through the light emission point of a lamp and being perpendicular to the lengthwise direction of the lamp is put and also an increasing angle NA is put in a direction away from the plane PL, as shown in FIG. 5, the luminous intensity distribution has a doughnut-like shape (with swells in lateral directions in the drawing) being revolutionally symmetrical with respect to an axis along the lengthwise direction of the lamp. More specifically, the light emission intensity is highest upon the plane PL and it decreases with enlargement of the angle NA. If such a lamp is combined with an elliptical mirror as shown in FIG. 4, the resultant luminous intensity distribution characteristic of light as collected at the second focal point is such as shown by a solid line in FIG. 6 that there is a central void (the distributed light intensity is close to zero in the vicinity of the angle (numerical aperture (NA) of zero), this being attributable also to the void in structure of the elliptical mirror 302.

On the other hand, an ultraviolet ray fiber capable of efficiently transmitting a wavelength not longer than 400 nm comprises a central core made of quartz glass and a peripheral core of a mixture of quartz glass with a small amount of impurities, causing a small decrease of refractive index. Through total reflection inside the fiber, the light is transmitted from the light entrance end to the light exit end. The material for producing such an ultraviolet ray fiber is currently limited only to quartz, and for this reason, the numerical aperture of the fiber (i.e., largest distribution angle transmissible with respect to the optical axis of the fiber) may be 0.2 to 0.25, at the best. A broken line in FIG. 6 depicts a luminous intensity distribution of light as received by the fiber, such as discussed above.

In the optical system of FIG. 4, therefore, the total light quantity which can be practically transmitted through the fiber corresponds to the integrated value, with respect to the angle NA, of multiplication of the two curves in FIG. 6. The quantity of light passing through the fiber is thus attenuated largely and, therefore, the illumination efficiency is still low.

SUMMARY OF THE INVENTION

It is an object of the present invention to provide an illumination optical system by which, in a system having a total reflection type light transmitting element, a high illumination efficiency can be attained.

In accordance with an aspect of the present invention, there is provided an illumination optical system, comprising: a luminous intensity distribution converting optical system for converting an illuminance distribution of a light source image into a luminous intensity distribution upon a predetermined plane; a total reflection type light transmitting element having its light entrance surface disposed substantially in coincidence with the predetermined plane; and a light collecting optical system for defining an illumination region upon a surface to be illuminated, by use of light from said light transmitting element.

In accordance with another aspect of the present invention, there is provided an illumination optical system, comprising: a luminous intensity distribution converting optical system for converting an illuminance distribution of a light source image into a luminous intensity distribution upon a predetermined plane; an optical fiber bundle having its light entrance surface disposed substantially in coincidence with the predetermined plane; and a light collecting optical system for defining an illumination region upon a surface to be illuminated, by use of light from said optical fiber bundle.

In accordance with a further aspect of the present invention, there is provided an illumination optical system, comprising: a luminous intensity distribution converting optical system for converting a luminous intensity distribution of plural light fluxes having different incidence angles into an illuminance distribution upon a predetermined plane; a total reflection type light transmitting element having its light entrance surface disposed substantially in coincidence with the predetermined plane; and a light collecting optical system for defining an illumination region upon a surface to be illuminated, by use of light from said light transmitting element.

In accordance with a yet further aspect of the present invention, there is provided an exposure apparatus, comprising: an illumination optical system as recited above; and a projection optical system for transferring, by exposure, a pattern of a mask as illuminated with said illumination optical system, onto a wafer.

In accordance with a still further aspect of the present invention, there is provided a device manufacturing method, comprising the steps of: applying a resist to a wafer; transferring, by exposure, a pattern of a mask onto the wafer by use of an exposure apparatus as recited above; and developing the wafer having the pattern transferred thereto.

These an other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 3 and 4 are schematic views, respectively, showing examples of illumination optical systems having a fiber bundle.

DESCRIPTION OF THE PREFERRED EMBODIMENTS

First Embodiment

Figure 7:
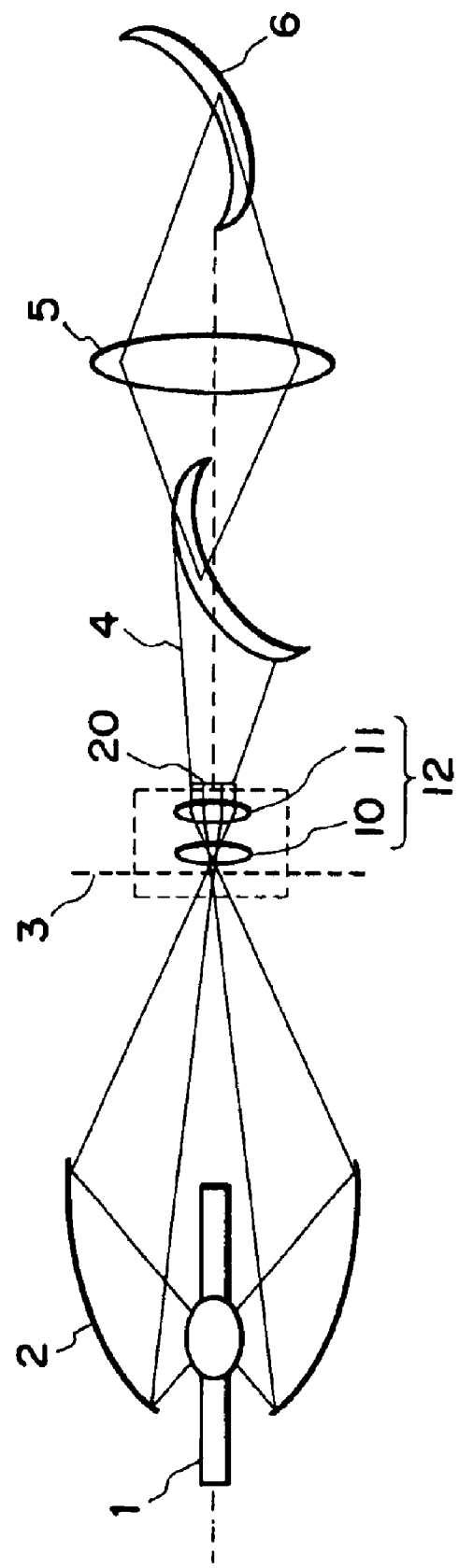
FIG. 7 is a schematic view of a general structure of an illumination optical system according to a first embodiment of the present invention.
Figure 8:
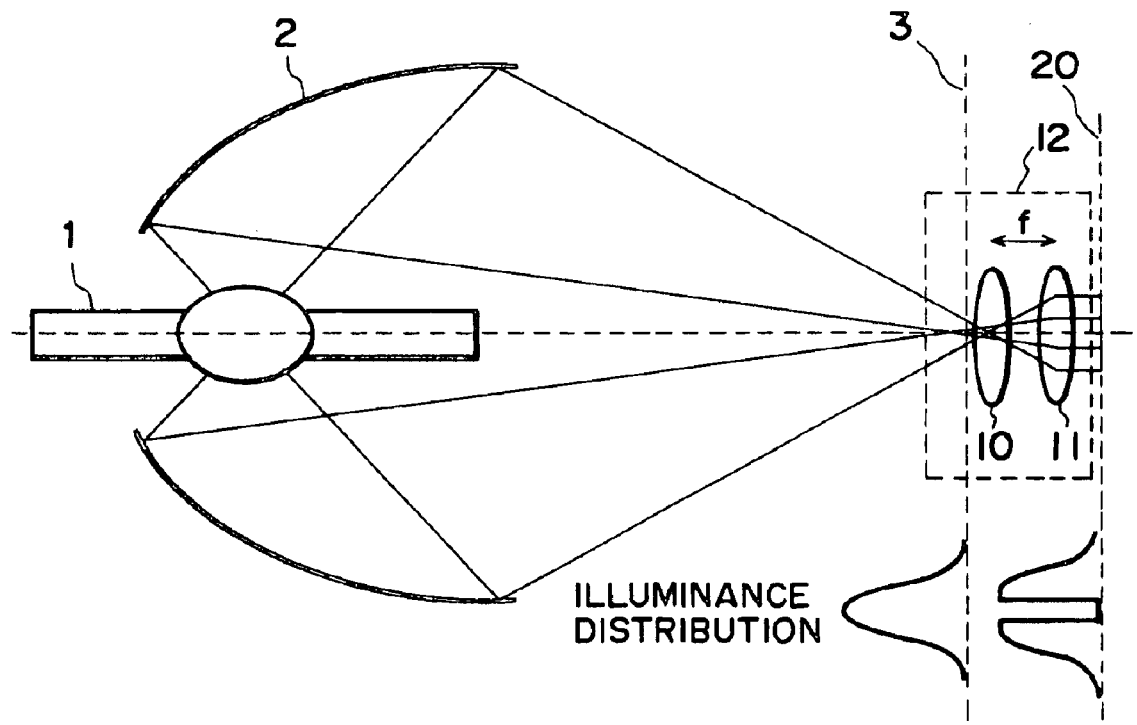
FIG. 8 is a schematic view for explaining details of a luminous intensity distribution converting optical system, in the first embodiment of the present invention.

FIG. 7 is a schematic view of a general structure of an illumination optical system according to a first embodiment of the present invention. FIG. 8 is a schematic view for explaining details of a luminous intensity distribution converting optical system of the illumination optical system of FIG. 7.

In FIG. 7, Hg lamp 1 has a light emission point which is disposed at one focal point (first focal point) of an elliptical mirror 2. Light emitted from the lamp 1 is collected by the influence of the mirror at another focal point (second focal point) of the mirror. The elliptical mirror 2 has another opening at its back, for replacement of an electrode of the lamp 1. Even if there is no such opening, because of the luminous intensity distribution characteristic of the lamp itself, substantially no light comes to the opening area at the back. Thus, at the second focal point plane 3, an illuminance distribution of Gaussian distribution shape (a distribution wherein the intensity (illuminance) is higher at a portion adjacent to the optical axis, than the intensity at a peripheral portion), due to the aberration of the mirror 2. Therefore, in terms of luminous intensity distribution, light having a distribution with a central void (a distribution wherein the intensity is large in a direction perpendicular to the optical axis, as compared with the intensity along the optical axis direction) is collected. The largest level of the luminous intensity distribution is determined by the opening diameter of the elliptical mirror 2.

Disposed adjacent to the second focal plane 3 is a luminous intensity distribution converting optical system 12, according to an important feature of the present invention. The converting optical system 12 comprises two lens units of a field lens 10 and a collimator lens 11. As shown in FIG. 8, these lens units have the same focal length f, with their principal points being spaced by the length f. This arrangement satisfies what can be called a Fourier transform relation, and an illuminance distribution upon an entrance pupil of the field lens 10 (i.e., upon the second focal plane 3) is converted into a luminous intensity distribution upon an exit pupil of the collimator lens 11 (i.e., upon the light entrance surface 20 of a fiber). Also oppositely, the luminous intensity distribution (with a central void) upon the entrance pupil of the field lens 10 is converted into an illuminance distribution upon the exit pupil of the collimator lens (the light entrance surface 20 of the fiber). The light beam diameters at these pupil planes are the same, in principle (no beam expansion). Fiber bundle 4, having plural optical fibers bound together, is used for arcuate illumination and, in this embodiment, the exit ends of the fibers are combined into an arcuate shape. By means of a condensing optical system 5 after the fiber bundle, the arcuate shape is imaged upon an imaging plane 6 (the surface to be illuminated). Basically, the fiber bundle does not change the luminous intensity distribution characteristic. Therefore, upon the imaging plane 6, a uniform luminous intensity distribution characteristic the same as that upon entry into the fiber bundle 4 is reproduced.

Figure 6:
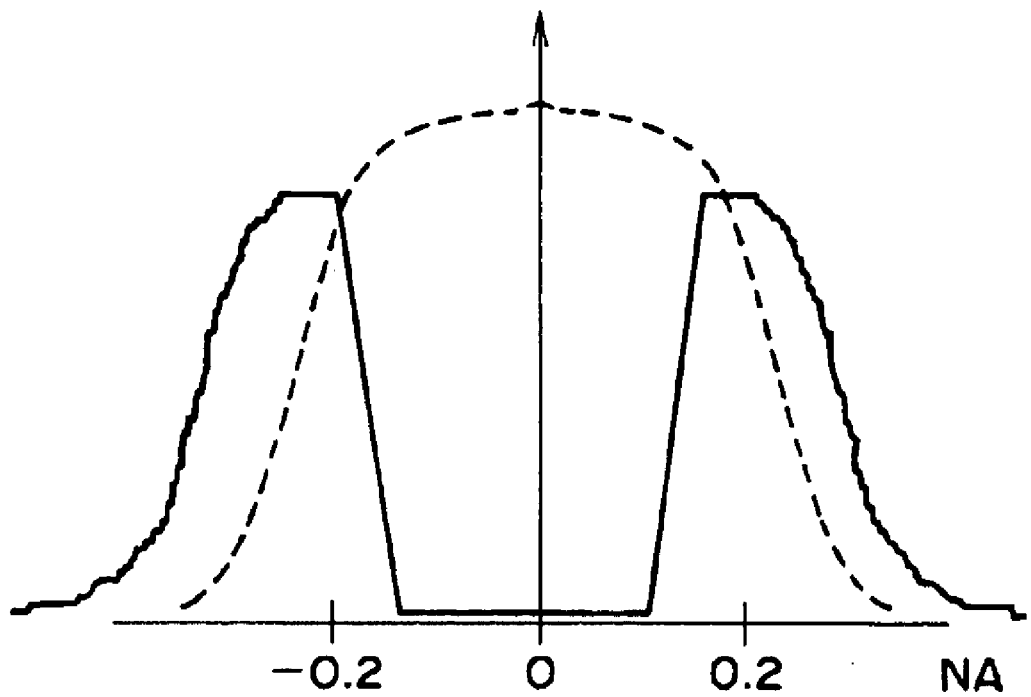
FIG. 6 is a schematic view for explaining an incidence luminous intensity distribution of light upon a fiber bundle.
Figure 9:
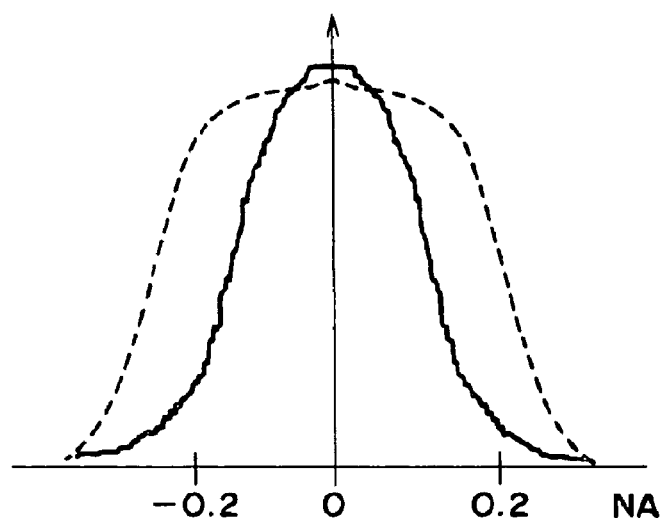
FIG. 9 is a schematic view for explaining an incidence luminous intensity distribution upon a fiber bundle, in the first embodiment of the present invention.

In FIG. 9, a broken line depicts the reception luminous intensity distribution characteristic of the fiber bundle 4, while a solid line depicts incidence luminous intensity distribution of light impinging on the fiber bundle 4 in accordance with this embodiment. Due to the function of the converting optical system 12, the incidence luminous intensity distribution of light into the fiber bundle 4 has a Gaussian distribution. Therefore, the substantive transmission light quantity of the fiber bundle 4 (the integrated value of the products of the curves of the solid line and broken line) increases notably as compared with that of the optical system of FIG. 6. Thus, the utilization efficiency of light emitted from the lamp 1, i.e., the illumination efficiency, is improved significantly. In this embodiment, the fiber bundle 4 functions to transform a light beam of a rectangular shape into a light beam of an arcuate shape, on the basis of the shapes of its entrance end and its exit end. However, even if the entrance end and exit end have the same shape, the advantageous effects of this embodiment are attainable.

Second Embodiment

Figure 10:
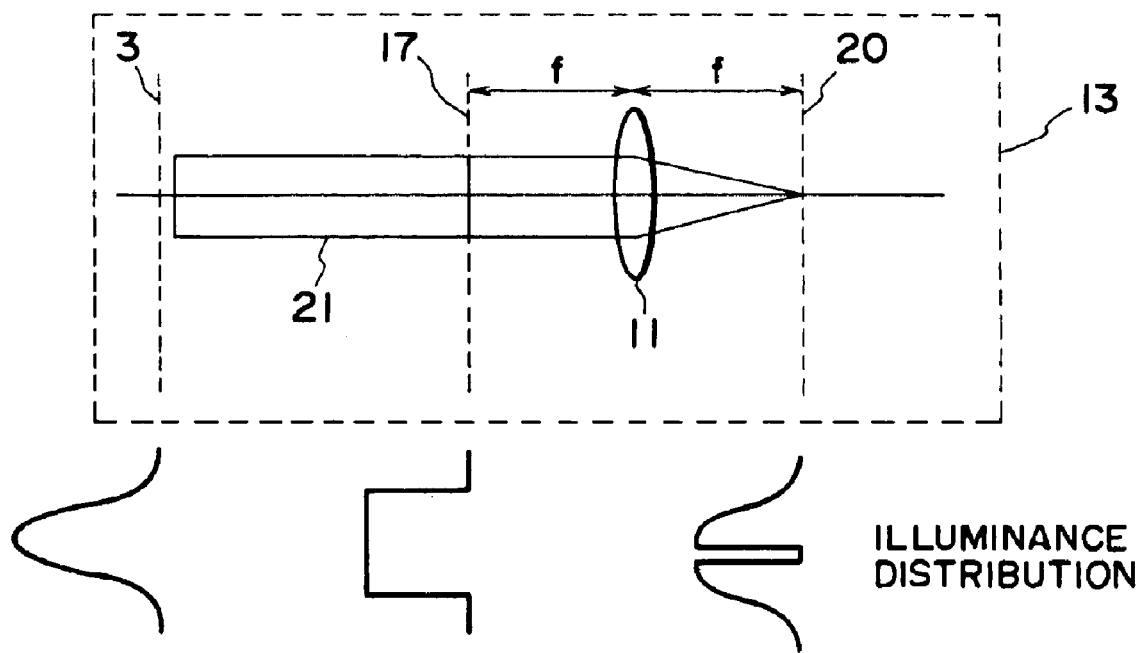
FIG. 10 is a schematic view of a general structure of a luminous intensity distribution converting optical system, in a second embodiment of the present invention.

This embodiment uses a converting optical system different from that of the first embodiment. Except for this, the structure is the same as that of the first embodiment. FIG. 10 is a schematic view of a general structure of a luminous intensity distribution converting optical system of this embodiment. This embodiment uses an optical rod 21, in place of the field lens 10 of FIG. 7. The optical rod 21 has a light entrance face which is disposed adjacent to the second focal plane 3 of the elliptical mirror 2. The light exit face of it is disposed at a front focal point plane 17 of the collimator lens 11. With this arrangement, even if there is an illuminance distribution of Gaussian shape at the light entrance face of the rod 21, a flat illuminance distribution can be produced at the light exit face of the rod 21 due to the uniforming effect of the rod (the degree of flatness is adjustable by the length of the rod). Therefore, the incidence luminous intensity distribution of light into the fiber bundle 4 can be flattened.

Figure 11:
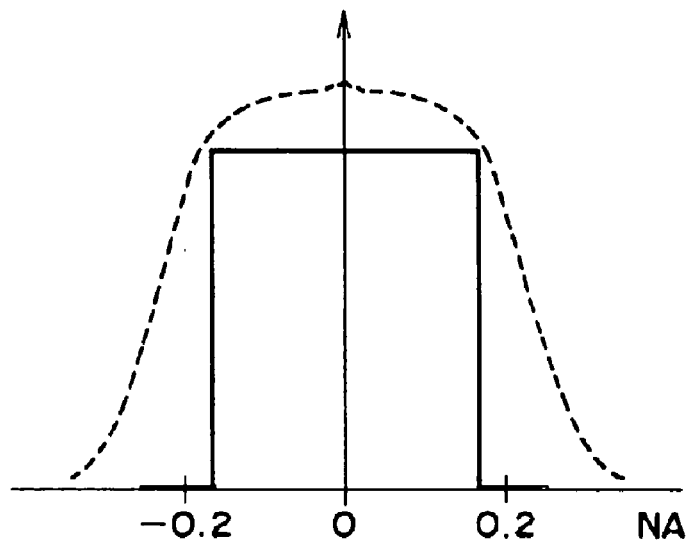
FIG. 11 is a schematic view for explaining an incidence luminous intensity distribution upon a fiber bundle, in the second embodiment of the present invention.

In FIG. 11, a solid line depicts an incidence luminous intensity distribution being flat, as can be provided by this embodiment. Like the case of FIG. 9, by multiplying it with the reception luminous intensity distribution characteristic (broken line) of the fiber bundle 4, the substantive transmission light quantity of the fiber bundle 4 is increased notably, and the illumination efficiency is improved significantly.

Third Embodiment

Figure 12:
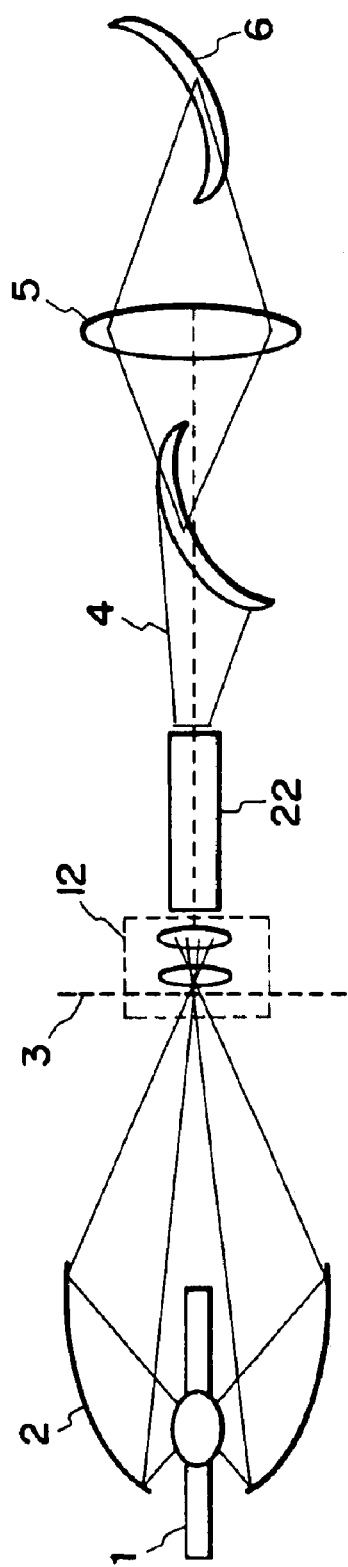
FIG. 12 is a schematic view of a general structure of an illumination optical system according to a third embodiment of the present invention.

FIG. 12 is a schematic view of a general structure of an illumination optical system according to a third embodiment of the present invention. This embodiment differs from the first embodiment of FIG. 7 in that an optical rod 22 is inserted between the luminous intensity distribution converting optical system 12 and the fiber bundle 4.

In the first embodiment, since the illuminance distribution upon the light entrance surface 20 of the fiber bundle has a central void, there may occur non-uniformness of illuminance at the light exit end. Such non-uniformness of illuminance may cause non-uniformness of illuminance upon the imaging plane 6. Therefore, when the illumination optical system of FIG. 7 is used in an exposure apparatus, the linewidth of a circuit pattern to be finally printed may become uneven, which may degrade the precision of the exposure. This may be avoided if the fibers are bound together at random. This embodiment, however, positively avoids it. In accordance with this embodiment, due to the function of the optical rod 22, light of a uniform illuminance distribution can be transmitted to the fiber bundle, such that the non-uniformness of illuminance upon the imaging plane 6 can be decreased significantly.

While the converting optical system 12 of this embodiment has the same structure as that of the first embodiment, it may have the same structure as that of the luminous intensity distribution converting optical system of the second embodiment shown in FIG. 10.

Fourth Embodiment

Figure 13:
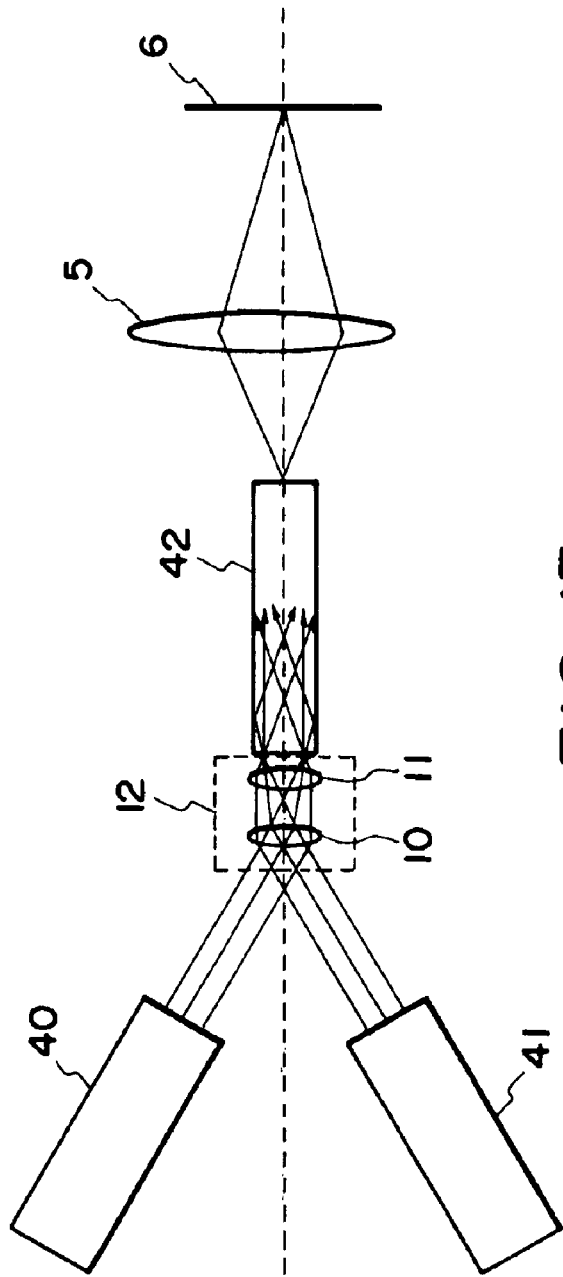
FIG. 13 is a schematic view of a general structure of an illumination optical system according to a fourth embodiment of the present invention.

FIG. 13 is a schematic view of a general structure of an illumination optical system according to a fourth embodiment of the present invention. While the preceding embodiments use a combination of a Hg lamp (as light source) and an elliptical mirror, this embodiment uses two lasers 40 and 41 as a light source and an optical system for directing light beams supplied from these lasers to an optical rod in oblique incidence. The luminous intensity distribution converting optical system of the first embodiment may be used as this directing optical system.

An optical rod is an optical element for transmitting light through total reflection. However, if the numerical aperture (NA) of light entering it is too large, all the light is not totally reflected and a portion of the light leaks out of the side face of the rod. In order to prevent this, the luminous intensity distribution converting optical system 12 is disposed at the entrance side of the rod 42, such that the numerical aperture (NA) of the light impinging on the rod 42 is converted toward the center. In the case of this embodiment, even if the distance between the field lens 10 and the collimator lens 11, constituting the luminous intensity distribution converting optical system 12, deviates from their focal lengths to some extent, it can be accepted unless it is within a range wherein the incident light can be transmitted by the rod on the basis of total reflection.

Fifth Embodiment

Figure 14:
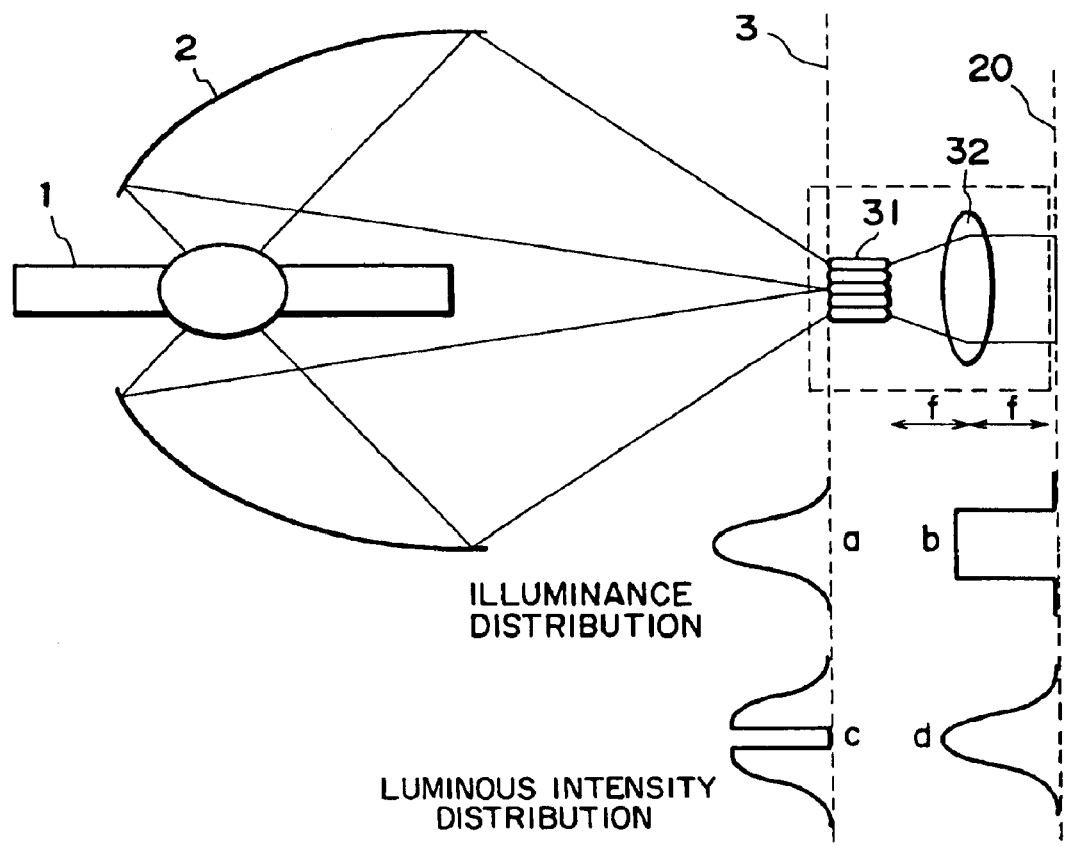
FIG. 14 is a schematic view for explaining a general structure of a luminous intensity distribution converting optical element, in a fifth embodiment of the present invention.

This embodiment uses a luminous intensity distribution converting optical system different from that of the first embodiment. Except for this, the structure is the same as that of the first embodiment. FIG. 14 is a schematic view of a general structure of a luminous intensity distribution converting optical system according to this embodiment.

The luminous intensity distribution converting optical system of this embodiment differs from that of the first embodiment in that a fly's eye lens 31 of a known structure is disposed at the second focal point position 3 of the elliptical mirror 2. The fly's eye lens 31 has its light exit surface disposed at a front focal point plane of a condenser lens 32, placed after the lens. Also, the fiber entrance surface 20 is disposed at the rear focal point plane of the condenser lens 32. With this structure, upon the second focal plane 3 and the fiber entrance surface 20, there are produced an illuminance distribution and a luminous intensity distribution such as shown in FIG. 14. More specifically, an illuminance distribution a of a Gaussian shape as defined at the light entrance surface of the fly's eye lens 31 (i.e., at the second focal point plane 3) is converted into a uniform distribution b upon the fiber entrance surface 20, due to the function of the fly's eye lens 31. Simultaneously, a luminous intensity distribution c having a shape with a central void as produced at the light entrance surface of the fly's eye lens 31 (the second focal point 3) is transformed into a Gaussian distribution d upon the fiber entrance surface 20. Thus, the present invention functions well.

Sixth Embodiment

Figure 15:
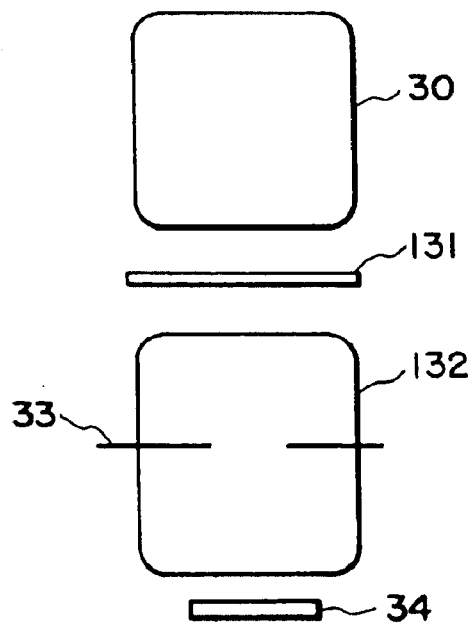
FIG. 15 is a schematic view of a general structure of an exposure apparatus according to a sixth embodiment of the present invention.

FIG. 15 is a schematic view for explaining a sixth embodiment of the present invention. This embodiment is directed to a system in which an illumination optical system according to any one of the first to fifth embodiments is incorporated into an exposure apparatus for manufacture of semiconductor devices. In FIG. 15, denoted at 30 is an illumination optical system such as described above. It functions to illuminate a mask 131 uniformly, which is placed at an imaging plane 6 or a plane optically conjugate therewith. Denoted at 132 is a projection optical system for lithographically transferring a circuit pattern, formed on the mask 131, onto a wafer 132 which is coated with a resist.

Figure 1:
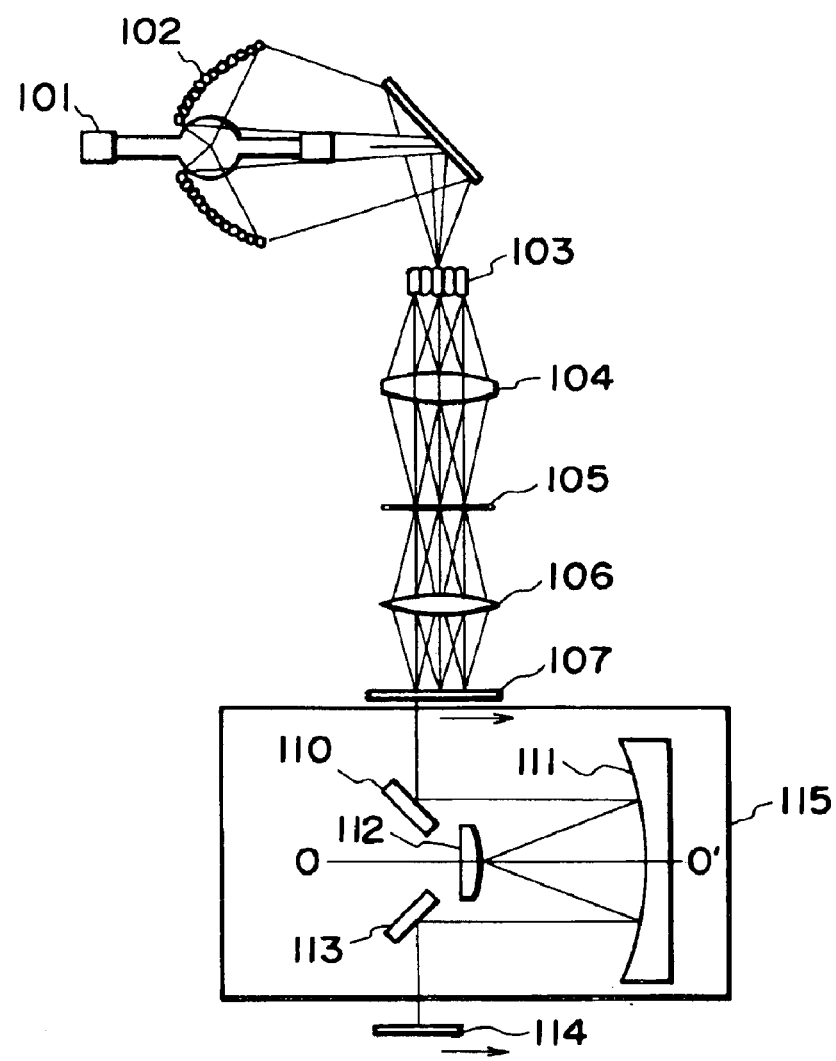
FIG. 1 is a schematic view of an example of a whole-exposure type scanning exposure apparatus.
Figure 2:
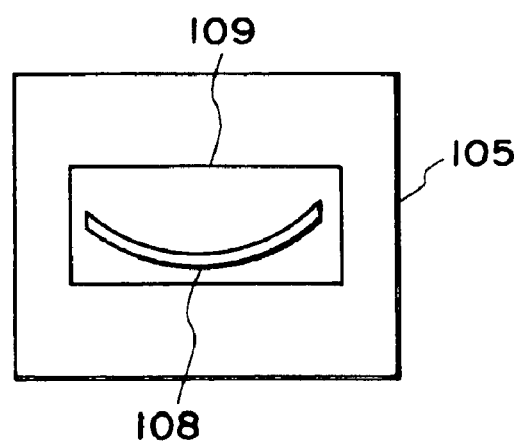
FIG. 2 is a schematic view for explaining an illumination region, in the apparatus of FIG. 1.
Figure 5:
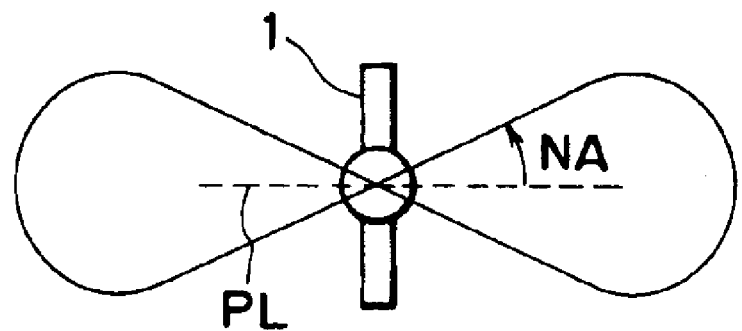
FIG. 5 is a schematic view for explaining a luminous intensity distribution of an ultra-high pressure Hg lamp.

In this embodiment, the projection optical system 132 may comprise a unit magnification type mirror scanning optical system such as shown in FIG. 1, or it may comprise a stepper reduction projection lens. Alternatively, this embodiment may be applied to an illumination optical system for a reduction type step-and-scan exposure apparatus (scanner).

When an illumination optical system according to the present invention is incorporated into an exposure apparatus such as described above, the following advantageous effects are obtainable. The luminous intensity distribution of illumination light such as shown in FIG. 9 is emitted from the illumination optical system with the distribution being preserved, and it illuminates the mask 131 surface (while a portion of the light is transformed into diffractive light), and it reaches the pupil plane 33 of the projection optical system 132. Upon this pupil plane 33, there is produced an illuminance distribution directly corresponding to the luminous intensity distribution at the mask 131 surface. Usually, this distribution is called an effective light source, and it is well known that the shape of this effective light source largely affects the resolution performance in pattern printing. If the distribution has a Gaussian shape (small sigma) wherein the light intensity is large at a portion close to the optical axis (NA=0) of the projection optical system 132, there is a tendency that, depending on the pattern, the resolution depth is expanded. Of course, the effect of high illumination efficiency through the illumination optical system 30 is held.

In the embodiments described above, the wavelength of illumination light to be used comprises a wavelength of about 350–450 nm, as that of i-line, h-line or g-line. Also, the glass material for the fiber may comprise a quartz material having a high transmission factor to such a wavelength. However, the present invention is not limited to what has been described above. Light of a longer wavelength such as visible light or infrared rays may be used, and the fiber may be made of a multiple-component glass material. On such an occasion, the transmission characteristic of the fiber is not limited to the total reflection type. A distributed refractivity type may be used, though there may be a similar problem as in the case of a total reflection type fiber. This is because it has no difference over the total reflection type fiber in that there is a limit with respect to the transmission luminous intensity distribution angle. Further, the same applies to deep ultraviolet light of a wavelength not longer than 200 nm.

Seventh Embodiment

Next, an embodiment of a semiconductor device manufacturing method which uses an exposure apparatus according to the sixth embodiment, will be explained.

Figure 16:
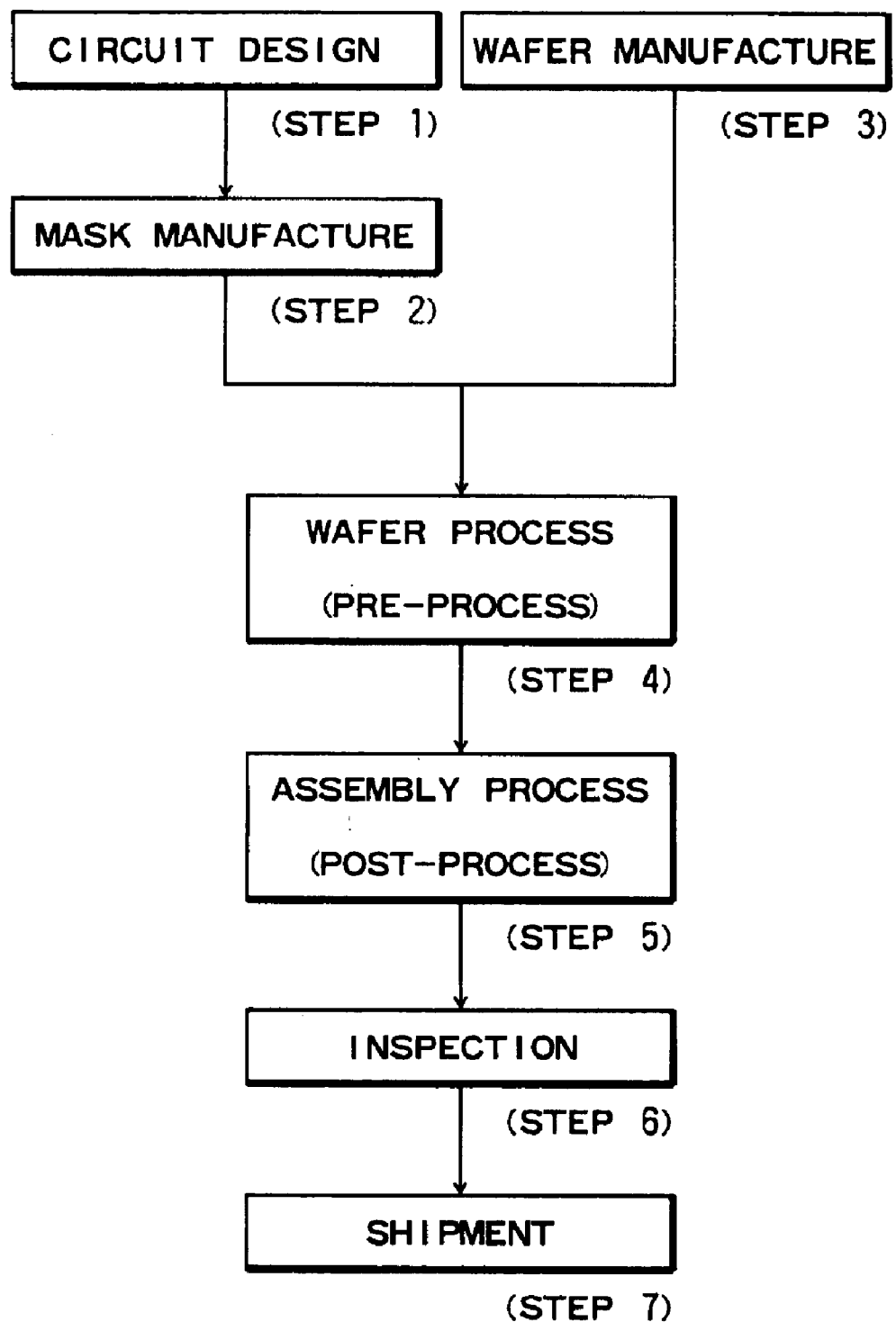
FIG. 16 is a flow chart of semiconductor device manufacturing processes.

FIG. 16 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 17:
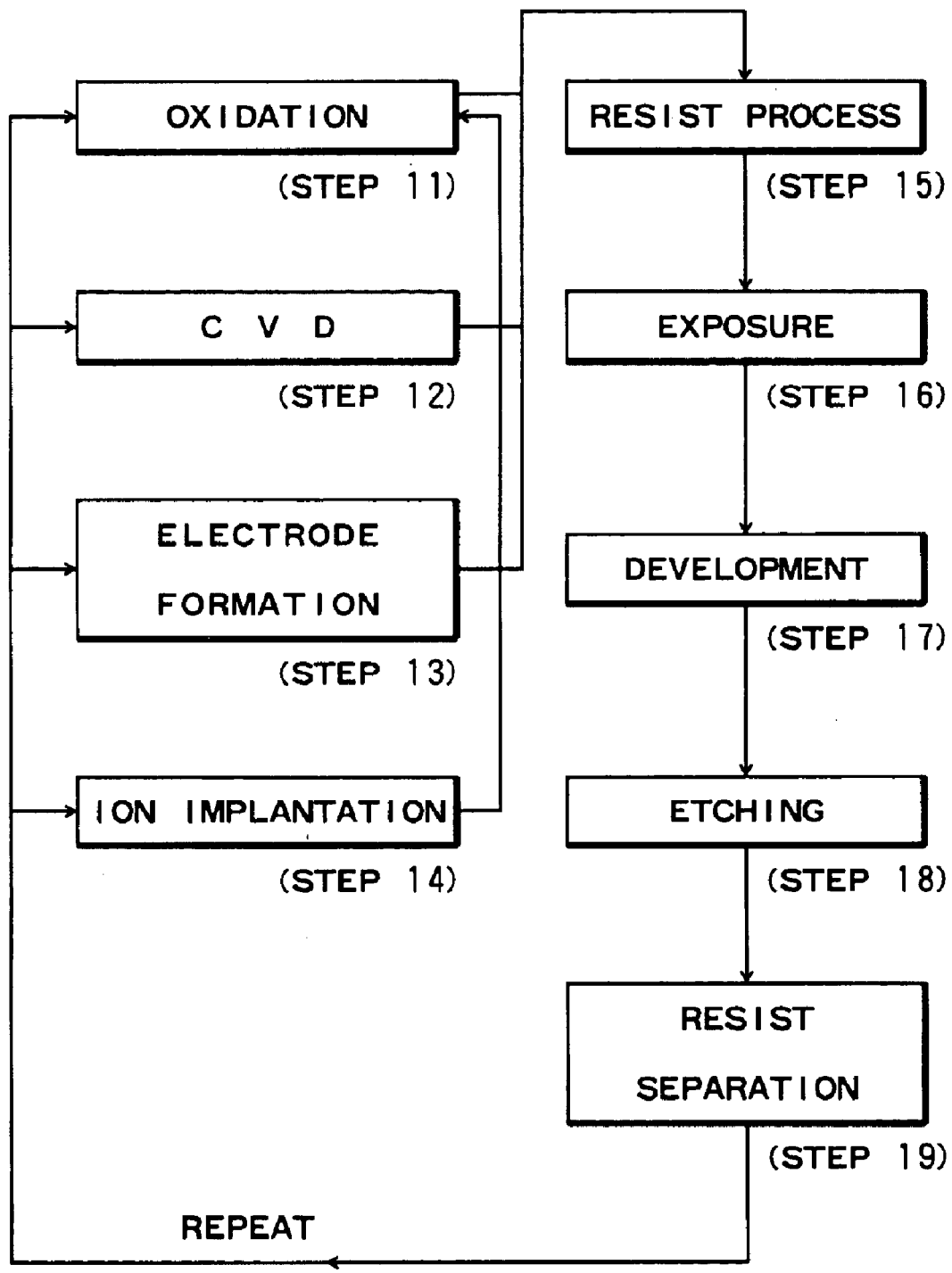
FIG. 17 is a flow chart for explaining details of a wafer process, in the procedure of FIG. 16.

FIG. 17 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An illumination optical system having a total reflection type light transmitting element, for illuminating a surface to be illuminated, said illumination optical system comprising:

an imaging optical system for forming an image of a light source upon a predetermined plane by use of light from the light source; and a converting optical system for directing light from the light source image formed by said imaging optical system, to said light transmitting element, wherein said converting optical system includes first and second lens units having the same focal distance and being disposed so that a distance between principal points of the two lens units becomes equal to the focal distance, and wherein an entrance pupil of the first lens unit is disposed substantially in coincidence with the predetermined plane, while an exit pupil of the second lens unit is disposed substantially in coincidence with a light entrance surface of said light transmitting element.

2. An illumination optical system according to claim 1, wherein the light source image formed by said imaging optical has an illuminance which is larger in a portion adjacent an optical axis of the light transmitting element than in a peripheral portion about the optical axis.

3. An illumination optical system according to claim 1, wherein said imaging optical system includes an elliptical mirror, wherein the light source is disposed at one focal point of said elliptical mirror, and wherein the light source image formed by said imaging optical system is defined at another focal point of said elliptical mirror.

4. An illumination optical system according to claim 1, wherein the light source comprises a Hg lamp.

5. An illumination optical system according to claim 1, wherein a luminous intensity distribution upon the predetermined plane has a distribution of a shape with a central void, and wherein said converting optical system is effective to make a luminous intensity distribution upon a light entrance surface of said light transmitting element into a distribution of a shape without a central void.

6. An illumination optical system for illuminating a surface to be illuminated, with light from a light source and by use of an optical fiber bundle, said illumination optical system comprising:

an imaging optical system for forming an image of a light source upon a predetermined plane, by use of light from the light source; and a converting optical system for directing light from the light source image formed by said imaging optical system, to said optical fiber bundle, wherein said converting optical system includes first and second lens units having the same focal distance and being disposed so that a distance between principal points of the two lens units becomes equal to the focal distance, and wherein an entrance pupil of the first lens unit is disposed substantially in coincidence with the predetermined plane, while an exit pupil of the second lens unit is disposed substantially in coincidence with a light entrance surface of said optical fiber bundle.

7. An illumination optical system according to claim 6, wherein the light source image formed by said imaging optical system has an illuminance which is larger in a portion adjacent an optical axis of the light transmitting element than in a peripheral portion about the optical axis.

8. An illumination optical system according to claim 6, wherein said imaging optical system includes an elliptical mirror, wherein the light source is disposed at one focal point of said elliptical mirror, and wherein the light source image formed by said imaging optical system is defined at another focal point of said elliptical mirror.

9. An illumination optical system according to claim 6, wherein the light source comprises a Hg lamp.

10. An illumination optical system according to claim 6, wherein said optical fiber bundle has a light entrance of one of square shape and rectangular shape, and a light exit face of arcuate shape.

11. An illumination optical system according to claim 6, wherein said optical fiber bundle comprises a total reflection type fiber bundle.

12. An illumination optical system according to claim 6, wherein said optical fiber bundle comprises a distributed refractivity type optical fiber bundle.

13. An illumination optical system according to claim 6, wherein a luminous intensity distribution upon the predetermined plane has a distribution of a shape with a central void, and wherein said converting optical system is effective to make a luminous intensity distribution upon a light entrance surface of said optical fiber bundle into a distribution of a shape without a central void.

14. An illumination optical system having a total reflection type light transmitting element, for illuminating a surface to be illuminated, said illumination optical system comprising:

a plurality of light sources for illuminating a predetermined plane; and a converting optical system, disposed between the predetermined plane and said light transmitting element, for directing light from said plurality of light sources to said light transmitting element, wherein said converting optical system includes first and second lens units having the same focal distance and being disposed so that a distance between principal points of the two lens units becomes equal to the focal distance, and wherein an entrance pupil of the first lens unit is disposed substantially in coincidence with the predetermined plane, while an exit pupil of the second lens unit is disposed substantially in coincidence with a light entrance surface of said light transmitting element.

15. An illumination optical system according to claim 14, wherein said light transmitting element comprises an optical rod.

16. An illumination optical system according to claim 14, wherein said plurality of light sources comprise a plurality of laser light sources.

17. An illumination optical system according to claim 14, wherein a luminous intensity distribution upon the predetermined plane has a distribution of a shape with a central void, and wherein said converting optical system is effective to make a luminous intensity distribution upon a light entrance surface of said light transmitting element into a distribution of a shape without a central void.

18. An illumination optical system for illuminating a surface to be illuminated, by use of an optical fiber bundle, said illumination optical system comprising:

a plurality of light sources for illuminating a predetermined plane; and a converting optical system disposed between the predetermined plane and said optical fiber bundle, for directing light from said plurality of light sources to said optical fiber bundle, wherein said converting optical system includes first and second lens units having the same focal distance and being disposed so that a distance between principal points of the two lens units becomes equal to the focal distance, and wherein an entrance pupil of the first lens unit is disposed substantially in coincidence with the predetermined plane, while an exit pupil of the second lens unit is disposed substantially in coincidence with a light entrance surface of said optical fiber bundle.

19. An illumination optical system according to claim 18, wherein a luminous intensity distribution upon the predetermined plane has a distribution of a shape with a central void, and wherein said converting optical system is effective to make a luminous intensity distribution upon a light entrance surface of said optical fiber bundle into a distribution of a shape without a central void.

20. An exposure apparatus comprising:
an illumination optical system having a total reflection type light transmitting element, for illuminating a mask, wherein said illumination optical system includes (i) an imaging optical system for forming an image of a light source upon a predetermined plane by use of light from the light source, and (ii) a converting optical system for directing light from the light source image formed by said imaging optical system, to said light transmitting element, wherein said converting optical system includes first and second lens units having the same focal distance and being disposed so that a distance between principal points of the two lens units becomes equal to the focal distance, and wherein an entrance pupil of the first lens unit is disposed substantially in coincidence with the predetermined plane, while an exit pupil of the second lens unit is disposed substantially in coincidence with a light entrance surface of said light transmitting element; and
a projection optical system for projecting a pattern of the mask onto a wafer.

21. A device manufacturing method, comprising steps of:
applying a resist to a wafer;
transferring, by exposure, a pattern of a mask onto the wafer by use of an exposure apparatus as recited in claim 20; and
developing the wafer having the pattern transferred thereto.

22. An exposure apparatus comprising:
an illumination optical system for illuminating a mask with light from a light source and by use of an optical fiber bundle, wherein said illumination optical system includes (i) an imaging optical system for forming an image of a light source upon a predetermined plane by use of light from the light source, and (ii) a converting optical system for directing light from the light source image formed by said imaging optical system, to said optical fiber bundle, wherein said converting optical system includes first and second lens units having the same focal distance and being disposed so that a distance between principal points of the two lens units becomes equal to the focal distance, and wherein an entrance pupil of the first lens unit is disposed substantially in coincidence with the predetermined plane, while an exit pupil of the second lens unit is disposed substantially in coincidence with a light entrance surface of said optical fiber bundle; and
a projection optical system for projecting a pattern of the mask onto a wafer.

23. A device manufacturing method, comprising the steps of:
applying a resist to a wafer;
transferring, by exposure, a pattern of a mask onto the wafer by use of an exposure apparatus as recited in claim 22; and
developing the wafer having the pattern transferred thereto.

24. An exposure apparatus comprising:
an illumination optical system having a total reflection type light transmitting element, for illuminating a mask, wherein said illumination optical system includes (i) a plurality of light sources for illuminating a predetermined plane, and (ii) a converting optical system disposed between the predetermined plane and said light transmitting element, for directing light from said plurality of light sources, to said light transmitting element, wherein said converting optical system includes first and second lens units having the same focal distance and being disposed so that a distance between principal points of the two lens units becomes equal to the focal distance, and wherein an entrance pupil of the first lens unit is disposed substantially in coincidence with the predetermined plane, while an exit pupil of the second lens unit is disposed substantially in coincidence with a light entrance surface of said light transmitting element; and
a projection optical system for projecting a pattern of the mask onto a wafer.

25. A device manufacturing method, comprising the steps of:
applying a resist to a wafer;
transferring, by exposure, a pattern of a mask onto the wafer by use of an exposure apparatus as recited in claim 24; and
developing the wafer having the pattern transferred thereto.

26. An exposure apparatus comprising:
an illumination optical system for illuminating a mask by use of an optical fiber bundle, wherein said illumination optical system includes (i) a plurality of light sources for illuminating a predetermined plane, and (ii) a converting optical system disposed between the predetermined plane and said optical fiber bundle, for directing light from said plurality of light sources, to said optical fiber bundle, wherein said converting optical system includes first and second lens units having the same focal distance and being disposed so that a distance between principal points of the two lens units becomes equal to the focal distance, and wherein an entrance pupil of the first lens unit is disposed substantially in coincidence with the predetermined plane, while an exit pupil of the second lens unit is disposed substantially in coincidence with a light entrance surface of said optical fiber bundle; and
a projection optical system for projecting a pattern of the mask onto a wafer.

27. A device manufacturing method, comprising the steps of:
applying a resist to a wafer;
transferring, by exposure, a pattern of a mask onto the wafer by use of an exposure apparatus as recited in claim 26; and
developing the wafer having the pattern transferred thereto.

28. An illumination optical system having a total reflection type light transmitting element, for illuminating a surface to be illuminated, said illumination optical system comprising:
an imaging optical system for forming an image of a light source upon a predetermined plane by use of light from the light source; and a converting optical system for directing light from the light source image formed by said imaging optical system, to said light transmitting element, wherein said converting optical system includes an optical rod and a lens unit, wherein a light entrance surface of said optical rod is disposed substantially in coincidence with the predetermined plane, while a light exit surface of said optical rod is disposed substantially in coincidence with a front focal plane of said lens unit, and a rear focal plane of said lens unit is disposed substantially in coincidence with a light entrance surface of said light transmitting element.

29. An illumination optical system for illuminating a surface to be illuminated, with light from a light source and by use of an optical fiber bundle, said illumination optical system comprising:

an imaging optical system for forming an image of a light source upon a predetermined plane, by use of light from the light source; and a converting optical system for directing light from the light source image formed by said imaging optical system, to said optical fiber bundle, wherein said converting optical system includes an optical rod and a lens unit, wherein a light entrance surface of said optical rod is disposed substantially in coincidence with the predetermined plane, while a light exit surface of said optical rod is disposed substantially in coincidence with a front focal plane of said lens unit, and a rear focal plane of said lens unit is disposed substantially in coincidence with a light entrance surface of said optical fiber bundle.

30. An illumination optical system having a total reflection type light transmitting element, for illuminating a surface to be illuminated, said illumination optical system comprising:

a plurality of light sources for illuminating a predetermined plane; and a converting optical system, disposed between the predetermined plane and said light transmitting element, for directing light from said plurality of light sources to said light transmitting element, wherein said converting optical system includes an optical rod and a lens unit, wherein a light entrance surface of said optical rod is disposed substantially in coincidence with the predetermined plane, while a light exit surface of said optical rod is disposed substantially in coincidence with a front focal plane of said lens unit, and a rear focal plane of said lens unit is disposed substantially in coincidence with a light entrance surface of said light transmitting element.

31. An illumination optical system for illuminating a surface to be illuminated, by use of an optical fiber bundle, said illumination optical system comprising:

a plurality of light sources for illuminating a predetermined plane; and a converting optical system disposed between the predetermined plane and said optical fiber bundle, for directing light from said plurality of light sources to said optical fiber bundle, wherein said converting optical system includes an optical rod and a lens unit, wherein a light entrance surface of said optical rod is disposed substantially in coincidence with the predetermined plane, while a light exit surface of said optical rod is disposed substantially in coincidence with a front focal plane of said lens unit, and a rear focal plane of said lens unit is disposed substantially in coincidence with a light entrance surface of said optical fiber bundle.

32. An exposure apparatus comprising:

an illumination optical system having a total reflection type light transmitting element, for illuminating a surface to be illuminated, wherein said illumination optical system includes (i) an imaging optical system for forming an image of a light source upon a predetermined plane by use of light from the light source, and (ii) a converting optical system for directing light from the light source image formed by said imaging optical system, to said light transmitting element, wherein said converting optical system includes an optical rod and a lens unit, a light entrance surface of said optical rod is disposed substantially in coincidence with the predetermined plane, while a light exit surface of said optical rod is disposed substantially in coincidence with a front focal plane of said lens unit, and a rear focal plane of said lens unit is disposed substantially in coincidence with a light entrance surface of said light transmitting element; and a projection optical system for projecting a pattern of a mask onto a wafer.

33. A device manufacturing method, comprising the steps of:

applying a resist to a wafer;

transferring, by exposure, a pattern of a mask onto the wafer by use of an exposure apparatus as recited in claim 32; and developing the wafer having the pattern transferred thereto.

34. An exposure apparatus comprising:

an illumination optical system for illuminating a surface to be illuminated, with light from a light source and by use of an optical fiber bundle, wherein said illumination optical system includes (i) an imaging optical system for forming an image of a light source upon a predetermined plane, by use of light from the light source, and (ii) a converting optical system for directing light from the light source image formed by said imaging optical system, to said optical fiber bundle, wherein said converting optical system includes an optical rod and a lens unit, a light entrance surface of said optical rod is disposed substantially in coincidence with the predetermined plane, while a light exit surface of said optical rod is disposed substantially in coincidence with a front focal plane of said lens unit, and a rear focal plane of said lens unit is disposed substantially in coincidence with a light entrance surface of said optical fiber bundle; and a projection optical system for projecting a pattern of a mask onto a wafer.

35. A device manufacturing method, comprising the steps of:

applying a resist to a wafer;

transferring, by exposure, a pattern of a mask onto the wafer by use of an exposure apparatus as recited in claim 34; and developing the wafer having the pattern transferred thereto.

36. An exposure apparatus comprising:

an illumination optical system having a total reflection type light transmitting element, for illuminating a surface to be illuminated, wherein said illumination optical system includes (i) a plurality of light sources for illuminating a predetermined plane, and (ii) a converting optical system, disposed between the predetermined plane and said light transmitting element, for directing light from said plurality of light sources to said light transmitting element, wherein said converting optical system includes an optical rod and a lens unit, a light entrance surface of said optical rod is disposed substantially in coincidence with the predetermined plane, while a light exit surface of said optical rod is disposed substantially in coincidence with a front focal plane of said lens unit, and a rear focal plane of said lens unit is disposed substantially in coincidence with a light entrance surface of said light transmitting element; and a projection optical system for projecting a pattern of a mask onto a wafer.

37. A device manufacturing method, comprising the steps of:

applying a resist to a wafer;

transferring, by exposure, a pattern of a mask onto the wafer by use of an exposure apparatus as recited in claim 36; and developing the wafer having the pattern transferred thereto.

38. An exposure apparatus comprising:

an illumination optical system for illuminating a surface to be illuminated, by use of an optical fiber bundle, wherein said illumination optical system includes (i) a plurality of light sources for illuminating a predetermined plane, and (ii) a converting optical system disposed between the predetermined plane and said optical fiber bundle, for directing light from said plurality of light sources to said optical fiber bundle, wherein said converting optical system includes an optical rod and a lens unit, a light entrance surface of said optical rod is disposed substantially in coincidence with the predetermined plane, while a light exit surface of said optical rod is disposed substantially in coincidence with a front focal plane of said lens unit, and a rear focal plane of said lens unit is disposed substantially in coincidence with a light entrance surface of said optical fiber bundle; and a projection optical system for projecting a pattern of a mask onto a wafer.

39. A device manufacturing method, comprising the steps of:

applying a resist to a wafer;

transferring, by exposure, a pattern of a mask onto the wafer by use of an exposure apparatus as recited in claim 38; and developing the wafer having the pattern transferred thereto.

* * * * *

UNITED STATES PATENT AND TRADEMARK OFFICE
CERTIFICATE OF CORRECTION

PATENT NO. : 6,857,764 B2
DATED : February 22, 2005
INVENTOR(S) : Michio Kohno

It is certified that error appears in the above-identified patent and that said Letters Patent is hereby corrected as shown below:

<u>Column 2,</u>
Line 9, "into a" should read -- into an --.
Line 32, "PL extending" should read -- PL is situated so as to extend --.
Line 33, "being" should read -- to be --.
Line 34, "lamp is put" should read -- lamp, --.

Signed and Sealed this

Twenty-third Day of August, 2005

JON W. DUDAS
*Director of the United States Patent and Trademark Office*